United States Patent [19]
Wheatland
[11] 4,178,179
[45] Dec. 11, 1979

[54] ELECTROPHOTOGRAPHIC MASTER CONVERSION SOLUTION

[75] Inventor: David A. Wheatland, Brunswick, Me.
[73] Assignee: Scott Paper Company, Philadelphia, Pa.

[21] Appl. No.: 911,453
[22] Filed: Jun. 1, 1978

Related U.S. Application Data

[63] Continuation of Ser. No. 743,592, Nov. 22, 1976, abandoned, which is a continuation of Ser. No. 600,226, Jul. 30, 1975, Pat. No. 4,007,126.

[51] Int. Cl.[2] .......... G03C 5/40; G03F 7/02
[52] U.S. Cl. .......... 430/49; 430/60; 430/97; 106/2; 148/6.15 Z; 252/182; 101/451; 101/465; 101/466
[58] Field of Search .......... 252/182, DIG. 11; 96/1 R, 1.4, 1.8, 36.3, 33; 106/2; 148/6.15 R; 101/451, 465, 466

[56] References Cited

U.S. PATENT DOCUMENTS

| | | | |
|---|---|---|---|
| 3,315,600 | 4/1967 | Tomanek | 101/465 |
| 3,323,451 | 6/1967 | Casey et al. | 101/466 |
| 3,672,885 | 6/1972 | Ort | 96/1.8 |
| 3,764,353 | 10/1973 | Shimizu et al. | 106/2 |
| 3,970,455 | 7/1976 | Nadsau et al. | 96/33 |

FOREIGN PATENT DOCUMENTS

| | | | |
|---|---|---|---|
| 257220 | 2/1961 | Australia | 101/465 |

*Primary Examiner*—Benjamin R. Padgett
*Assistant Examiner*—Irwin Gluck
*Attorney, Agent, or Firm*—Nicholas J. DeBenedictis; John W. Kane, Jr.

[57] ABSTRACT

A conversion solution for zinc oxide coated electrophotographic master printing plates is provided containing triethylenetetramine or ethylenediamine which replaces the normally used ferrocyanide in conventional EP master conversions solutions.

7 Claims, No Drawings

ELECTROPHOTOGRAPHIC MASTER CONVERSION SOLUTION

This is a continuation of application Ser. No. 743,592 abandoned. filed 11/22/76 which is a continuation of Ser. No. 600,226 issued as U.S. Pat. No. 4,007,126, filed 7/30/75.

BACKGROUND OF THE INVENTION

1. Field of the Invention

This invention concerns conversions solutions for zinc oxide containing electrophotographic, planographic master printing plates.

2. Description of the Prior Art

Direct or off-set printing with an electrophotographic planographic master plate is a well known art which includes techniques such as lithography, flexographic printing and the like. An electrophotographic master plate is produced for printing which relies upon the difference between ink repellent, water receptive non-imaged portions of the master and water repellent, ink receptive imaged portions of the master.

The master plate is fabricated of a base material such as metal, plastic, paper or laminated base sheets to which is applied a zinc oxide-resinous binder coating having the desired photoconductive properties for the development of a latent electrostatic image by any of the well known electrostatic techniques (Xerography). Such images when developed by suitable ink-receptive, water-repellent liquid or powder developers, still require treatment of the imaged surface to enhance the desired water-receptive, ink-repellent properties of the non-imaged portions of the master surface. Enhanced water-receptive, ink-repellent characteristics are necessary for a direct or off-set master plate in order to produce fine quality copies.

A solution used for treating an imaged, developed, electrophotographic master plate (EP master) to enhance the differences between the water-receptive (hydrophilic) and water-repellent (hydrophobic) areas of the master is referred to hereinafter as an EP master conversion solution.

EP master conversion solutions have been formulated with potassium ferrocyanide usually in combination with a humectant, such as glycerine or glycol along with buffers for proper pH adjustment such as monobasic ammonium phosphate or sodium phosphate and phosphoric acid, (see U.S. Pat. No. 3,001,872). Chelating agents have been added to such ferrocyanide EP master conversion solutions (See U.S. Pat. No. 3,672,885.)

An electrophotographic master plate which employs hydrophobic imaged areas and hydrophilic non-imaged areas is commonly referred to as a lithographic printing plate. This term is used to designate plates which are adapted for either off-set or direct lithographic printing.

A conversion solution for master plates having a zinc oxide containing coating enhances the hydrophilicity of the non-imaged areas by depositing a hydrophilic zinc chelate on the non-imaged areas of the plate. An alkali metal ferrocyanide or an alkali metal ferricyanide conversion solution such as disclosed in U.S. Pat. No. 3,661,598 reacts with the nonimaged areas of the zinc oxide coating to liberate zinc ions which form an insoluble hydrophilic zinc chelate with the ferrocyanide ion which precipitate is deposited upon the non-imaged areas of the plate. Such ferrocyanide containing conversion solutions are subject to decomposition and accordingly stabilizers and buffers are often added to retard oxidative or dissociative decomposition usually caused by exposure of the solution to light or air. The possibility of decomposition is a major disadvantage of ferrocyanide based conversion solutions because of the potential for the evolution of hydrogen cyanide during decomposition at low pH levels. While buffers tend to minimize the probability of the evolution of hydrogen cyanide, the evolution of such a dangerous gas is always present with ferrocyanide based conversion solutions.

SUMMARY OF THE INVENTION

An electrophotographic master conversion solution is provided for enhancing the hydrophilicity of non-imaged areas of electrophotographic master plates suitable for offset or direct printing. The EP master conversion solution is an acidic aqueous solution containing an active amount of a compound capable of producing anions suitable for forming an insoluble hydrophilic chelate with zinc cations (obtained from zinc oxide contained in a photoconductive layer of an electrophotographic master plate), said compound selected from the group consisting of triethylenetetramine (TETA) and ethylenediamine (EN).

DESCRIPTION OF THE PREFERRED EMBODIMENTS

The ferrocyanide compound of conventional EP conversion solutions is replaced according to the present invention with triethylenetetramine (TETA) and/or ethylenediamine (EN), which compounds can form a hydrophilic chelate with zinc ions. When phosphate ions are present under acidic conditions (preferably a pH of about 4.0) the hydrophilic chelate combines with the phosphate ion to form an insoluble hydrophilic precipitate. This insoluble hydrophilic chelate is deposited upon the non-imaged areas of the electrophotographic master plate from the conversion solution.

The chemical reactions by which the invention is believed to function are as follows:

Triethylenetetramine forms a tetradentate chelate with zinc ions as follows:

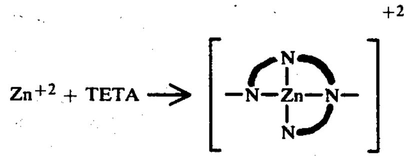

When phosphate ion is present at an acidic pH the complex combines with phosphate to form an insoluble hydrophilic precipitate. The chemical reaction is believed to be as follows:

$$Zn(TETA)^{+2}+2H_2PO_4^{-1}\rightarrow[Zn(TETA\ H_4)]^{+6}(PO_4)_2^{-6}\downarrow$$

Infrared spectroscopic analysis of the insoluble hydrophilic precipitate indicated that the complex precipitate contains both ligand and $PO_4^{-3}$. Spot tests of the complex precipitate indicated both the presence of $Zn^{+2}$ and $PO_4^{-3}$.

It has been determined that ethylenediamine precipitates in similar reactions to the above and results in an insoluble hydrophilic complex precipitate as follows:

$[Zn(EN.H_2)_2]^{+6}(PO_4)_2^{-6}$

Analysis of both the TETA and the EN based complexes indicated that both contained about 16% Zn which is in accord with the above formulas for the complex precipitates.

Similar amines capable of forming chelates such as diethylenetriamine and tetraethylenepentamine while forming precipitates did not form hydrophilic precipitates and accordingly were not suitable for the present invention.

An acidic pH (below 7) is required and preferred is a pH of about 4.0.

EXAMPLE 1

A 0.1 molar triethylenetetramine solution was prepared by mixing 14.6 grams TETA with water to make a liter of solution having a pH of 11.4. The solution was adjusted to a pH of 4.0 by adding 0.32 mols of phosphoric acid (22 milliliters of 85% $H_3PO_4$). To this conversion solution was added 5 milliliters of 0.47M $ZnCl^2$ solution. A white precipitate immediately formed indicating the rapid conversion possible on a printing master.

EXAMPLE 2

An aqueous conversion solution was prepared having a TETA concentration of 0.05M and a monosodium phosphate concentration of 1.0 molar. The pH of the conversion solution was 4.5. In addition two comparison conversion solutions were prepared one containing only the monosodium phosphate at a concentration of 1.0 molar and the other a conventional conversion solution containing monosodium phosphate at a concentration of 1.0 molar and $K_4Fe(Cn)_4$ at a concentration of 0.05 molar. Each of the conversion solutions were used to convert an imaged and developed electrophotographic master plate type EP-134 manufactured by S. D. Warren and having a zinc oxide containing coating. Each of the plates were treated with a different conversion solution by hand according to usual techniques. Each of the plates were mounted on an Addressograph-Multigraph 1250 Multilith press with a Repellex fountain (phosphate and glycerine containing solution). The EP plates converted with the solution of this invention and with the conventional solution both produced offset copies having clear, sharp images of comparable quality while the EP plate that was treated with the conversion solution containing only monosodium phosphate toned excessively in background areas.

The pH of the conversion solution must be acidic (less than 7) and preferrably from about 3 to about 5. The solution must contained phosphate ions which could be obtained from phosphoric acid, alkali metal phosphates such as monosodium phosphate or other well known sources for phosphate ions in aqueous solutions such as ammonium phosphate. Preferrably the phosphate ions are present in the sclution at an ion concentration of from about [0.01] per liter to about [1.0] per liter.

Conversion of an electrophotographic master plate is accomplished by treating the plate with a conversion solution of the present invention according to standard procedures for treating EP plates with conventional conversion solutions, (usually by gently wiping the solution onto the plate). The converted plate is usually washed with water to remove the conversion solution.

When treating an EP plate with a conversion solution of the present invention, treatment time with the conversion solution is not critical but is dependent somewhat on the concentration of the ingredients in the solution. For strong (concentrated) treating solutions, treatment times of a few seconds may be adequate while with weak treating solutions, treatment times of several minutes might be more desirable.

Normally the concentration of the active ingredient (TETA or EN) is from about 0.01 molar to about 1.0 molar. However an affective concentration of the active ingredient is not limited to the preferred range. Lower concentrations could be used with longer treating times. Concentrations higher than the preferred range are functional in the present invention, however, the added expense of using a higher concentration of the active ingredient is not usually justified.

What is claimed is:

1. A method of converting electrophotographic master plates having a zinc oxide containing coating by enhancing the hydrophilic properties of non-imaged portions of the electrophotographic master plate; comprising contacting the master plate with an acidic, aqueous conversion solution consisting essentially of phosphate ions and an active amount of a compound capable of forming an insoluble hydrophilic chelate with zinc ions in the presence of phosphate ions, said compound selected from the group consisting of triethylenetetramine and ethylenediamine.

2. The method of claim 1 wherein the compound selected is triethylenetetramine and present in a molar concentration of from 0.01 to 1.0 in said aqueous solution.

3. The method of claim 2, wherein the aqueous solution has a pH of about 4 and an alkali metal phosphate is used as the source of phosphate ions in said aqueous solution.

4. The method of claim 1, wherein the aqueous solution has a pH of about 4 and phosphoric acid is used as the source of phosphate ions.

5. The method of claim 1, wherein the compound selected is ethylenediamine and present in said aqueous solution in a molar concentration of from about 0.01 to about 1.0.

6. The method of claim 5, wherein the aqueous solution has a pH of about 4 and an alkali metal phosphate is used as the source of phosphate ions in said aqueous solution.

7. The method of claim 5, wherein the aqueous solution has a pH of about 4 and phosphoric acid is used as the source of phosphate ions in said aqueous solution.

* * * * *